United States Patent [19]

Jackson

[11] Patent Number: 4,979,177
[45] Date of Patent: Dec. 18, 1990

[54] ENHANCED COUNTER/TIMER RESOLUTION IN A LOGIC ANALYZER

[75] Inventor: Ronald M. Jackson, Portland, Oreg.

[73] Assignee: Tektronix, Inc., Beaverton, Oreg.

[21] Appl. No.: 427,157

[22] Filed: Oct. 26, 1989

[51] Int. Cl.⁵ .............................................. G04F 10/04
[52] U.S. Cl. ...................................... 377/20; 368/118; 328/72; 375/118; 377/55
[58] Field of Search ....................... 377/20, 55; 328/72, 328/129.1; 368/118; 375/118; 324/78 R, 78 D

[56] References Cited

U.S. PATENT DOCUMENTS

| | | | |
|---|---|---|---|
| 4,352,195 | 9/1982 | Dautremay et al. | 328/72 |
| 4,468,746 | 8/1984 | Davis | 377/20 |
| 4,495,621 | 1/1985 | Nakagomi et al. | 371/6 |
| 4,514,835 | 4/1985 | Bottigheimer et al. | 368/118 |
| 4,546,487 | 10/1985 | Dackow | 377/20 |
| 4,559,636 | 12/1985 | Goldrian | 377/20 |
| 4,584,695 | 4/1986 | Wong et al. | 328/72 |
| 4,737,942 | 4/1988 | Nishibe | 368/118 |
| 4,777,616 | 10/1988 | Moore et al. | 364/900 |
| 4,789,789 | 12/1988 | Kersenbrock et al. | 307/40 |
| 4,849,924 | 7/1989 | Providenza et al. | 364/770 |
| 4,868,430 | 9/1989 | Stewart | 328/72 |
| 4,870,664 | 9/1989 | Hayashi | 377/20 |
| 4,912,734 | 3/1990 | Frauenglass | 377/20 |

OTHER PUBLICATIONS

Tektronix, 1240/1241 Logic Analyzer Service Manual, 1985, pp. 4-57, to 4-72, and Schematics 18, 18A, 22-25.
Tektronix, 92A16/16E User's Manual, 1987, pp. 2-31, to 2-54.

Primary Examiner—John S. Heyman
Attorney, Agent, or Firm—Boulden G. Griffith

[57] ABSTRACT

A logic analyzer has a counter/timer that can reconstruct the higher resolution with which data was acquired using multiple phases of the logic analyzer system clock signal. For a two-phase data sampling system, separate pairs of event recognizers monitor the data collected using the two phases of the system clock. Counter/timer control logic uses the information from these separate pairs of event recognizers to control the behavior of the counter/timer so that it can either single count or double count, depending on whether an event was true during both phases or only one phase of the data acquisition, thus allowing the counter/timer resolution to be as high as the information inherent in the data acquired using both clock phases. The counter/timer employed is capable of single or double counting and has two stages, a prescaler and an extension counter/timer, for increased power and cost effectiveness. An event recognizer is capable of recognizing words, ranges, unstable data, glitches, and/or other signal characteristics.

8 Claims, 9 Drawing Sheets

ENHANCED COUNTER/TIMER RESOLUTION IN A LOGIC ANALYZER

BACKGROUND OF THE INVENTION

This invention relates to the field of digital data acquisition and logic analysis, and more particularly to the field of counting and timing intervals with enhanced resolution in a logic analyzer or other digital data acquisition instrument.

Logic analyzers are digital data acquisition instruments that allow a user to acquire and analyze digital data from a large number of logic signals, such as the address, data, and control lines of a microprocessor. The logic analyzer periodically compares each of these logic signals to a reference threshold in order to determine which logic state, high or low, each of the lines is in.

Trigger sections allow operators to specify when in time they would like to acquire data, i.e. which data they are interested in. This is necessary because even the largest acquisition memories are quickly filled by all the data occurring in a fast electronic system. The trigger is the most important reference time in a logic analyzer, since it initiates the sequence of activities associated with data acquisition and is frequently the reference time for other measurements.

Using the human interface of the trigger section, the operator specifies a sequence of events or particular conditions, which, if they occur, indicate that this is the data that the operator is interested in. While the logic analyzer is running waiting for the specified trigger conditions to occur, the digital data from the system under test is sent to a circular memory, which may be overwritten and refilled many times before the trigger occurs indicating that the interval of interest has been reached.

When the triggering conditions have been satisfied, the flow of new data into the circular memory is interrupted and the data present is saved. This storage of digital data can occur immediately upon the occurrence of the trigger condition or after a variable delay. If the writing to memory is stopped immediately, the memory contains data reflecting the activity that occurred prior to the trigger event, i.e. "pretrigger" data. Conversely, if the memory is allowed to keep filling for its whole length after the trigger condition occurs, the contents of the memory reflects entirely the activity that occurred immediately after the trigger event, i.e., is "posttrigger" data. Typically, any one of a number of combinations of pretrigger and posttrigger data storage can be selected. Which combination a user chooses is dictated by the problem they are trying to solve and which conditions in the temporal vicinity of the problem can be identified well enough to program the trigger machine.

The trigger sections of some logic analyzers also contain one or more counter/timers. These allow the trigger condition to be specified in terms of a number of occurrences of some event or in terms of a time. For example, a timer can be used to measure the interval between two events and the trigger section can be programmed to produce a trigger when this time exceeds a certain value. Or, the counter/timer can be made to count every occurrence of event A and to reset upon the occurrence of event B, with the trigger section programmed to produce a trigger if the count of A occurrences reaches a particular value.

A logic analyzer has an internal clock rate that places a limit on how fast it can process incoming digital data and how much resolution it can have. Resolution is the minimum time interval that it can distinguish. Normally, if a logic analyzer has a 5ns internal clock period, it can not make any measurement with more resolution than 5ns. However, it is possible to acquire data with more resolution than it has previously been possible to perform counter/timer operations on it. By using both edges of one clock signal, or by using two clock signals 180 degrees out of phase, an internal clock signal with a 5ns clock period can be used to acquire data every 2.5ns. But, as this data moves into the logic analyzer, two of these 2.5ns samples must be processed with every 5ns clock signal. Previously, counter/timer measurements have been limited in their resolution to the period of the acquisition system clock.

What is desired is to have a logic analyzer, or other digital data acquisition instrument, with a counter/timer that can reconstruct the higher resolution with which data was originally acquired using multiple phases of the logic analyzer system clock, rather than having the resolution be limited to the period of the acquisition system clock.

SUMMARY OF THE INVENTION

The present invention is a logic analyzer in which a counter/timer can reconstruct the higher resolution with which data was acquired using multiple phases of the logic analyzer system clock signal. For a two-phase data sampling system, separate pairs of event recognizers monitor the data collected using the two phases of the system clock. Counter/timer control logic uses the information from these separate pairs of event recognizers to control the behavior of the counter/timer so that it can either single count or double count, depending on whether an event was true during both phases or only one phase of the data acquisition, thus allowing the counter/timer resolution to be as high as the information inherent in the data acquired using both clock phases.

It is an object of the present invention to be able count or time intervals in acquired digital data with a resolution as high as the acquisition rate using multiple phases of a system clock.

It is a feature of this invention that it has separate event recognizers for each clock phase acquisition and that it has a control logic that can convert the information from the multiple event recognizers into different count instructions and that it has a counter/timer that can respond to those count instructions by performing multiple increments within one system clock cycle.

It is an advantage of this invention that the timing resolution available from the output of the counter/timer corresponds to the high data acquisition rate of the multiple clock phases, rather than being limited to the resolution of the system clock itself.

DETAILED DESCRIPTION

A logic analyzer embodying the present invention may have an internal clock rate of 200 MHz, but nonetheless sample and acquire digital data at 400 MHz by using both edges of its internal clock for data sampling. As the data moves into the logic analyzer, a pair of successive samples are processed together at 200 MHz. The most recently acquired sample of the two is referred as the "young" data and the older of the two is referred to as the "middle" data. "Old" data is the young data from the previous sample pair. Separate pairs of event recognizers monitor the young and middle data, for a total of four event recognizers, A-young, A-middle, B-young, and B-middle. Event recognizers can identify words, glitches, unstable data, ranges, transitions into or out of a particular state, and/or other signal characteristics. Word recognition determines whether or not an ANDed combination of "1"s, "0"s, "don't care"s, and "in-between"s is present on specified signal lines. Range recognition determines whether data is within a particular range of values, e.g., whether an address is within the address range of a particular subroutine. Unstable data recognizers react to transitions into or out of either logic state. Glitches recognizers react to extra transitions in the data between samples or pulse widths below a certain minimum value. Glitch recognition across specified signal lines is generally ORed together, as is unstable data recognition.

Figure 1A:
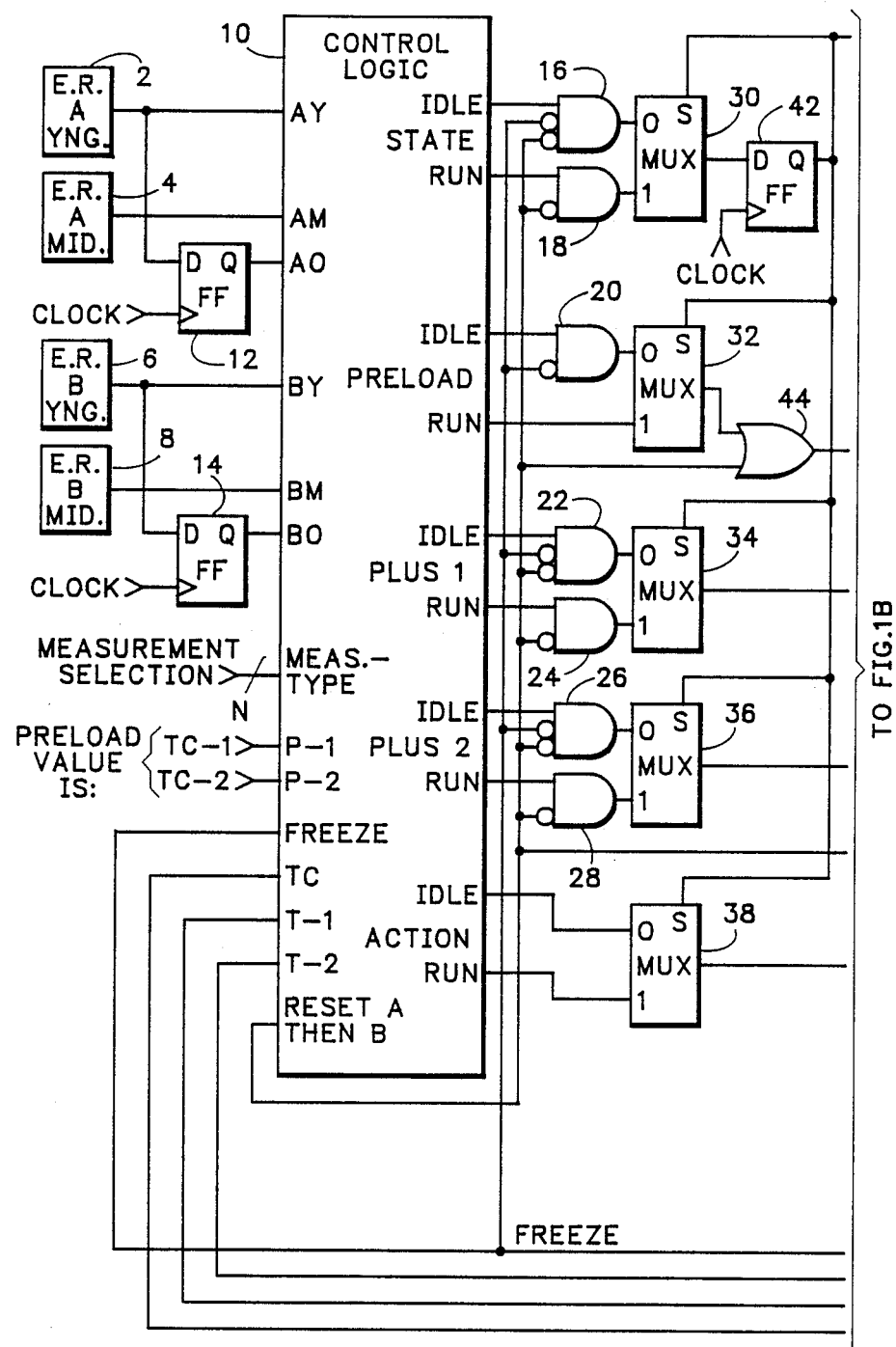
FIGS. 1A-1B are a mixed block and schematic diagram of the Counter/Timer, the Trigger Machine and the Control Logic for the counter/timer.
Figure 1B:
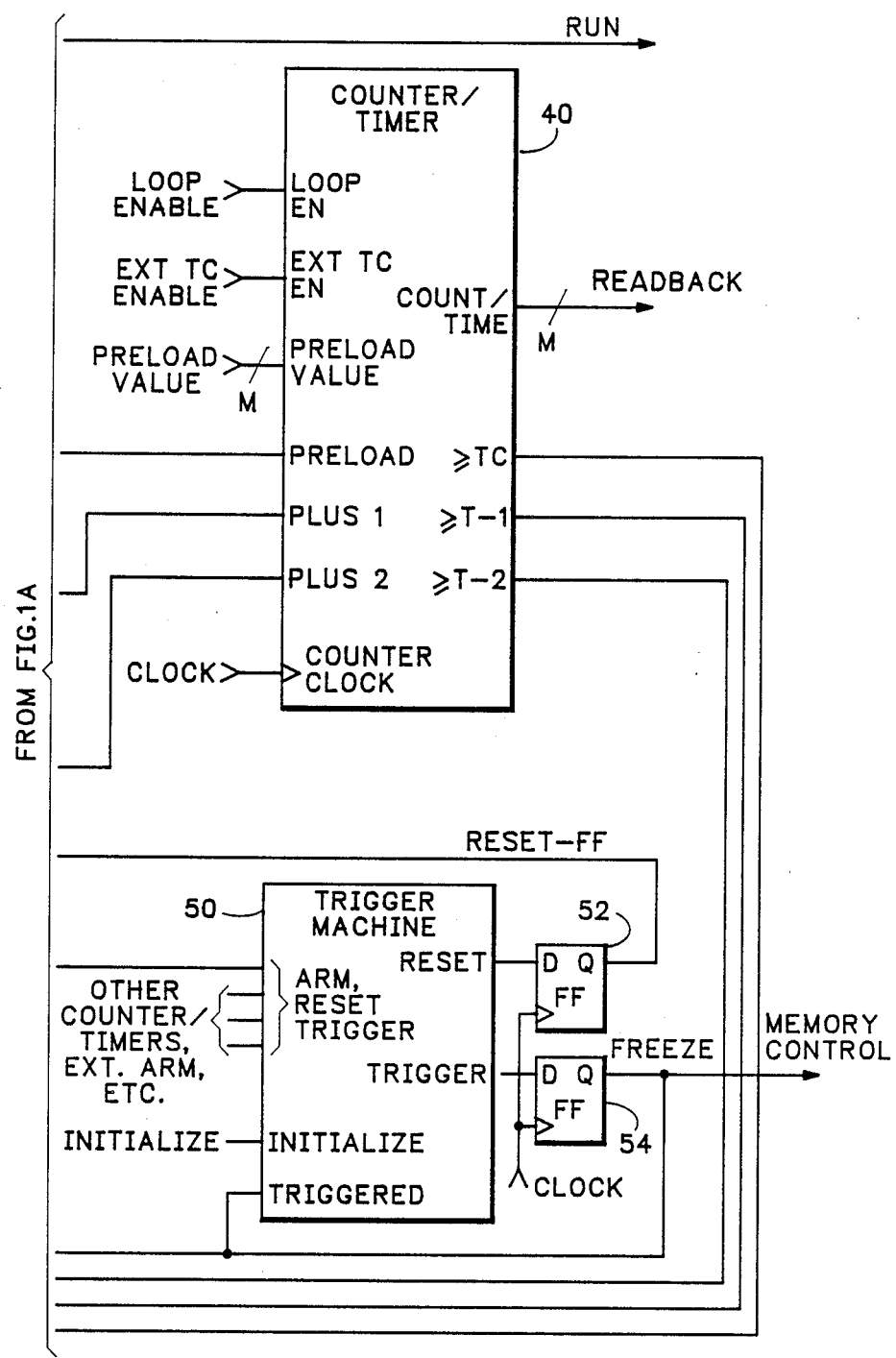

Referring to FIGS. 1A–1B, a number of Measurement (Type) Selection signals are applied to the inputs MEAS-TYPE to select the mode that the Control Logic 10 uses to control the Counter/Timer 40. Four of these signals are needed to select between the sixteen possible measurement types available in this implementation. Table 1 shows the sixteen measurement types and the value of the MEAS-TYPE signals that selects them:

Two other inputs to the Control Logic 10 are P-1 and P-2. These indicate, respectively, that the value being programmed into the Counter/Timer 40 is one less than the terminal count or two less than the terminal count. These inputs allow the Control Logic 10 to anticipate and deal appropriately with short counts. The Counter/Timer 40 is implemented as an adder, so the preloaded value is the one's complement of the desired number and the terminal count occurs at all ones.

The Control Logic 10 also has as inputs the terminal count minus two T-2, the terminal count minus one T-1, and the terminal count TC outputs from the Counter/Timer 40. These signals keep the Control Logic 10 informed of the status of the Counter/Timer as it nears the terminal count. Another input to the Control Logic 10 is RESET A THEN B. This signal resets that portion of the logic that is remembering that A has occurred when a RESET-FF occurs before B during an "Event A Then B" MEAS.-TYPE. (Recall from Table 1 that "Event A Then B" does not use the Counter/Timer 40.) The remaining input to the Control Logic is FREEZE, the TRIGGER output of the Trigger Machine 50 after it is clocked into flip-flop 54. The occurrence of this signal puts the Control Logic in a mode that allows the present measurement to be completed, but no further measurements to start.

The Control Logic 10 outputs are STATE-IDLE, STATE-RUN, PRELOAD-IDLE, PRELOAD-RUN, PLUS1-IDLE, PLUS1-RUN, PLUS2-IDLE, PLUS2-RUN, ACTION-IDLE, and ACTION-RUN. Additional control logic 16–38 between the Control Logic 10 outputs and the inputs to the Counter/Timer 40 and Trigger Machine 50 qualifies these outputs with the status of the FREEZE and RESET-FF signals from the flip-flops 52 and 54 on the output of the Trigger Machine Which of each of these pairs of signals, the IDLE version or the RUN version, is applied to the Counter/Timer 40 is determined by multiplexers 30–38 under the control of the RUN signal.

The equations implemented by the Control Logic block 10 are shown in Tables 2A through 2E. In each of

TABLE 1

| | | MEASUREMENT TYPES | | | |
|---|---|---|---|---|---|
| | | Counter/Timer Control | | Action Control | |
| Meas. Type | Type of Measurement | Idle Equation | Run Equation | Idle Equation | Run Equation |
| 0 | Duration >= | 0 | 8 | 0 | 16 |
| 1 | Duration < | 0 | 8 | 1 | 17 |
| 2 | Period >= | 1 | 9 | 2 | 18 |
| 3 | Period < | 1 | 9 | 3 | 19 |
| 4 | Delay >= | 2 | 10 | 4 | 20 |
| 5 | Delay < | 2 | 10 | 5 | 21 |
| 6 | Accum. Time >= | 3 | 11 | 6 | 22 |
| 7 | Events A or B | * | * | 7 | 23 |
| 8 | Count >= | 4 | 12 | 8 | 24 |
| 9 | Count < | 4 | 12 | 9 | 25 |
| 10 | Time While >= | 5 | 13 | 10 | 26 |
| 11 | Time While < | 5 | 13 | 11 | 27 |
| 12 | Setup Time < | 6 | 14 | 12 | 28 |
| 13 | Events A and B | * | * | 13 | 29 |
| 14 | Hold Time < | 7 | 15 | 14 | 30 |
| 15 | Events A then B | * | * | 15 | 31 |

*Do not use counter/timer

The Control Logic 10 also receives the output of the four event recognizers described above as its inputs AY, AM, BY, and BM. The young data from each set of event recognizers is also applied to a flip-flop 12 or 14 that delays it one CLOCK cycle, so that it is old data at the inputs AO and BO of the Control Logic 10.

these Tables, the top set of the equations control the status of the idle version of the signal, while the bottom set of equations control the status of the run version. In these tables, "n" means "not", "A" and "B" indicate which event recognizer the following "X"s and "1"s and "0"s refer to, "1"s signify a high "0"s a low, "X"s a "don't care", "*" means the AND function, and "+" means the OR function. AND operations take precedence over OR operations. The first of the three numbers in a set is "old" data for that event recognizer, while the next number is the "middle" data and the final one is the "young" data.

TABLE 2A

| | STATE SIGNAL LOGIC EQUATIONS (0 = idle; 1 = run) |
|---|---|
| 0 | A011 + AX01 |
| 1 | A01X + AX01 |
| 2 | AX01 * nBX01 + A01X * n(B01X + BX01) |
| 3 | AX01 * nBX01 + A01X * n(B01X + BX01) |
| 4 | AX01 * BXX0 + A01X * BX00 |
| 5 | AXX1 * BXX0 + AX1X * BX00 |
| 6 | AX1X * n(B01X + BX01) + AXX1 * nBX01 |
| 7 | AX00 * B01X + AXX0 * BX01 |
| 8 | n(AXX0 + AX0X * FREEZE) |
| 9 | n((A01X + AX01) * FREEZE) |
| 10 | n(BX01 + B01X * (nAX01 + FREEZE) |
| 11 | n(BX01 + B01X * (nAX01 + FREEZE) |
| 12 | n(B011 + BX01 + B010 * (nAX01 + FREEZE)) |
| 13 | n(B011 + BX01 + B010 * (nAXX1 + FREEZE)) |
| 14 | n(BX01 + B01X * (nAXX1 + FREEZE)) |
| 15 | n(AXX1 + AX10 * (nBX01 + FREEZE) + (B01X + BX01) * nFREEZE) |

TABLE 2B

| | PRELOAD SIGNAL LOGIC EQUATIONS |
|---|---|
| 0 | A01X + AX01 |
| 1 | A01X + AX01 |
| 2 | A01X + AX01 |
| 3 | always 0 |
| 4 | AX01 * BXX0 + A01X * BX0X + B01X + BX01 |
| 5 | AXX1 * BXX0 + AX1X * BX0X + B01X + BX01 |
| 6 | AX1X + AXX1 |
| 7 | B01X + BX01 |
| 8 | AX01 * nFREEZE |
| 9 | (A01X + AX01) * nFREEZE |
| 10 | A01X + AX01 * (nFREEZE + nB01X) |
| 11 | always 0 |
| 12 | (AX01 * B010) * nFREEZE |
| 13 | (AXX1 * B010) * nFREEZE |
| 14 | AX1X + AX01 * (nB01X + nFREEZE) |
| 15 | (B01X + BX01) * nFREEZE |

TABLE 2C

| | PLUS 1 SIGNAL LOGIC EQUATIONS |
|---|---|
| 0 | A010 + AX01 |
| 1 | AX01 |
| 2 | AX01 * nBX01 + A01X * BX01 |
| 3 | AX01 * nBX01 + A01X * BX01 |
| 4 | AX01 * BXX0 + A01X * BX0X |
| 5 | AX01 * BXX0 + AX10 * BX0X + AXX1 * BX10 + A01X * BX01 |
| 6 | AXX1 * nBX01 + AX10 * BX01 |
| 7 | AX01 * B01X + AXX0 * BX01 |
| 8 | AX10 + AX01 * nFREEZE |
| 9 | AX01 |
| 10 | nAX01 * BX01 + AX01 * n(B01X + BX01) + AX01 * B01X * nFREEZE |
| 11 | AX01 + BX01 + nFREEZE * B01X |
| 12 | AX01 * BX00 + A01X * BX0X + nFREEZE * AX01 * BX10 |
| 13 | AX10 * BX0X + AX01 * BX00 + AX11 * BX01 + nFREEZE * AXX1 * BX10 |
| 14 | AXX0 * BX01 + AXX1 * n(B01X + BX01) + nFREEZE * AXX1 * B01X |
| 15 | AX00 * BX01 + AX01 * n(B01X + BX01) + FREEZE * AX01 * BX01 + nFREEZE * (AX10 * BX01 + AX01 * B01X) |

TABLE 2D

| | PLUS 2 SIGNAL LOGIC EQUATIONS |
|---|---|
| 0 | A011 |
| 1 | A01X |
| 2 | A01X * n(B01X + BX01) |
| 3 | A01X * n(B01X + BX01) |
| 4 | always 0 |
| 5 | AX11 * BX00 |
| 6 | AX10 * n(B01X + BX01) |
| 7 | AX00 * B01X |
| 8 | AX11 |
| 9 | n(A01X + AX01) + nFREEZE * A01X |
| 10 | n(A01X + AX01) * n(B01X + BX01) + A01X * n(B01X + BX01) |
| 11 | n(B01X + BX01) |
| 12 | always 0 |
| 13 | AX11 * BX00 |
| 14 | AXX0 * n(B01X + BX01) |
| 15 | AX00 * n(B01X + BX01) + nFREEZE * AX00 * B01X |

TABLE 2E

| | ACTION SIGNAL LOGIC EQUATIONS |
|---|---|
| 0 | P-1 * (A01X + AX01) + P-2 * A011 |
| 1 | A010 * n(P-1) |
| 2 | A01X * (P-2) |
| 3 | always 0 |
| 4 | P-1 * (A01X * nB01X + AX01 * nBX01) + P-2 * A01X * n(B01X + BX01) |
| 5 | A01X * B01X + AX01 * BX01 + nP-1 * A01X * BX01 |
| 6 | T-1 * (A01X * BX01 + AX01 * nBX01) + T-2 * A01X * n(B01X + BX01) |
| 7 | Event A or Event B |
| 8 | P-1 * (A01X * BX0X + AX01 * BXX0) |
| 9 | B01X + BX01 * n(P-1 * A01X) |
| 10 | P-1 * (AX1X * BX0X + AXX1 * BXX0) + P-2 * AX11 * BX00 |
| 11 | B01X + BX01 * n(P-1 * AX1X) |
| 12 | AX1X * B01X + AXX1 * BX01 + nP-1 * AX10 * BX01 |
| 13 | Event A and Event B |
| 14 | AX1X * B01X + AXX1 * BX01 + nP-1 * AX01 * B01X |
| 15 | Event A then Event B |
| 16 | P-1 * AX01 + T-1 * AX1X + T-2 * AX11 |
| 17 | nT-1 * AX10 + nTC * AX0X |
| 18 | T-1 * nA01X + T-2 * n(A01X + AX01) |
| 19 | A01X * nTC + AX01 * nT-1 |
| 20 | P-1 * (A01X * nB01X + AX01 * nBX01) + P-2 * A01X * n(B01X + BX01) + T-1 * n(A01X + B01X) + T-2 * n(A01X + AX01) * n(B01X + BX01) |
| 21 | A01X * B01X + AX01 * BX01 + A01X * BX01 * P-1 + B01X * nTC + BX01 * nT-1 |
| 22 | T-1 * (BX01 + B01X * AX01) + T-2 * n(B01X + BX01) |
| 23 | Event A or Event B |
| 24 | P-1 * B010 * AX01 + TC * nB01X + T-1 * (A01X * BX0X + AX01 * BX00) |
| 25 | B01X * nTC + BX01 * n(A01X * T-1 + TC) |
| 26 | P-1 * B010 * AXX1 + TC * nB01X + T-1 * (AX1X * BX0X + AX01 * BX00) + T-2 * AX11 * BX00 |
| 27 | B01X * nTC + BX01 * n(AX1X * T-1 + TC) |
| 28 | B01X * AX1X + BX01 * AXX1 + AX10 * BX01 * nP-1 + B01X * nTC + AX00 * BX01 * nT-1 |
| 29 | Event A and Event B |
| 30 | B01X * AX1X + BX01 * AXX1 + B01X * AX01 * nP-1 + AX1X * nTC + AX01 * nT-1 |
| 31 | Event A then Event B |

The Control Logic block happens to be implemented with logic gates, but the same result could be achieved using RAM or PROM, or anything else that could implement the logic equations shown in Tables 2A through 2E. Depending on the implementation, the nature of the Measurement Selection signals would have to be changed. For example, if RAM were used to implement these equations, appropriate programming data would be required, as well as some means, such as multiplexers, for allowing the programmed address to be asserted by different configurations of the input data in different modes, and by the controlling processor for preprogramming.

Also, in the present implementation, the additional control logic 16-38 is implemented by discrete gates and multiplexers external to the Control Logic block 10. This logic could, however, be put inside the Control Logic block 10, by the addition of suitable terms to the equations given below.

In addition to producing the terminal count indication, $>=TC$, the Counter/Timer 40 also produces the related signals $>=T-1$ and $>=T-2$. The signal $>=T-1$ means greater than or equal to one less than the terminal count, while the signal $>=T-2$ means greater than or equal to two less than the terminal count. The Counter/Timer 40 also produces a set of M signals COUNT/TIME for readback by the logic analyzer's microprocessor (not shown) In one implementation, M is 52 bits wide The microprocessor also readsback the status of the signal RUN to ascertain whether the measurement had been completed.

As inputs, the Counter/Timer 40 receives M lines of PRELOAD VALUE that is the one's complement of the desired count. It also receives a PRELOAD signal that causes the PRELOAD VALUE to be loaded. The COUNTER CLOCK input is connected to the system CLOCK signal The PLUS 1 and PLUS 2 inputs to the Counter/Timer 40 cause the Counter/Timer to increment by one or two, respectively. Thus, it can be seen that the Counter/Timer 40 is capable of single or double counting on each occurrence of the CLOCK. The Counter/Timer also receives two additional inputs, LOOP ENABLE and EXT TC ENABLE. The operation of the Counter/Timer 40 and the significance of these inputs will be discussed further below in connection with FIGS. 2A, 2B and 2C.

The Trigger Machine 50 receives the signal ACTION from the Control Logic 10 and produces a RESET signal or a TRIGGER signal according to its internal logic. If its inputs would cause it to try to produce both a RESET and a TRIGGER signal, the TRIGGER takes precedence. The TRIGGER output of the Trigger Machine 50 becomes FREEZE after it is clocked into flip-flop 54. The signal FREEZE is connected to the TRIGGERED input of the State Machine 50 to keep TRIGGER and FREEZE asserted after the triggering event, in this case ACTION, goes away. The INITIALIZE signal puts the Trigger Machine 50 into a known starting state, clears TRIGGER, and causes a RESET signal to occur. RESET becomes RESET-FF on the next CLOCK and operates to PRELOAD the Counter/Timer 40 through OR gate 44 and set the state to idle by disabling AND gates 16 and 18, thereby making both inputs to Mux 30 false. The low out of Mux 30 makes RUN go false by resetting flip-flop 42 on the next CLOCK, putting Muxes 30-38 in their idle state.

Figure 2A:
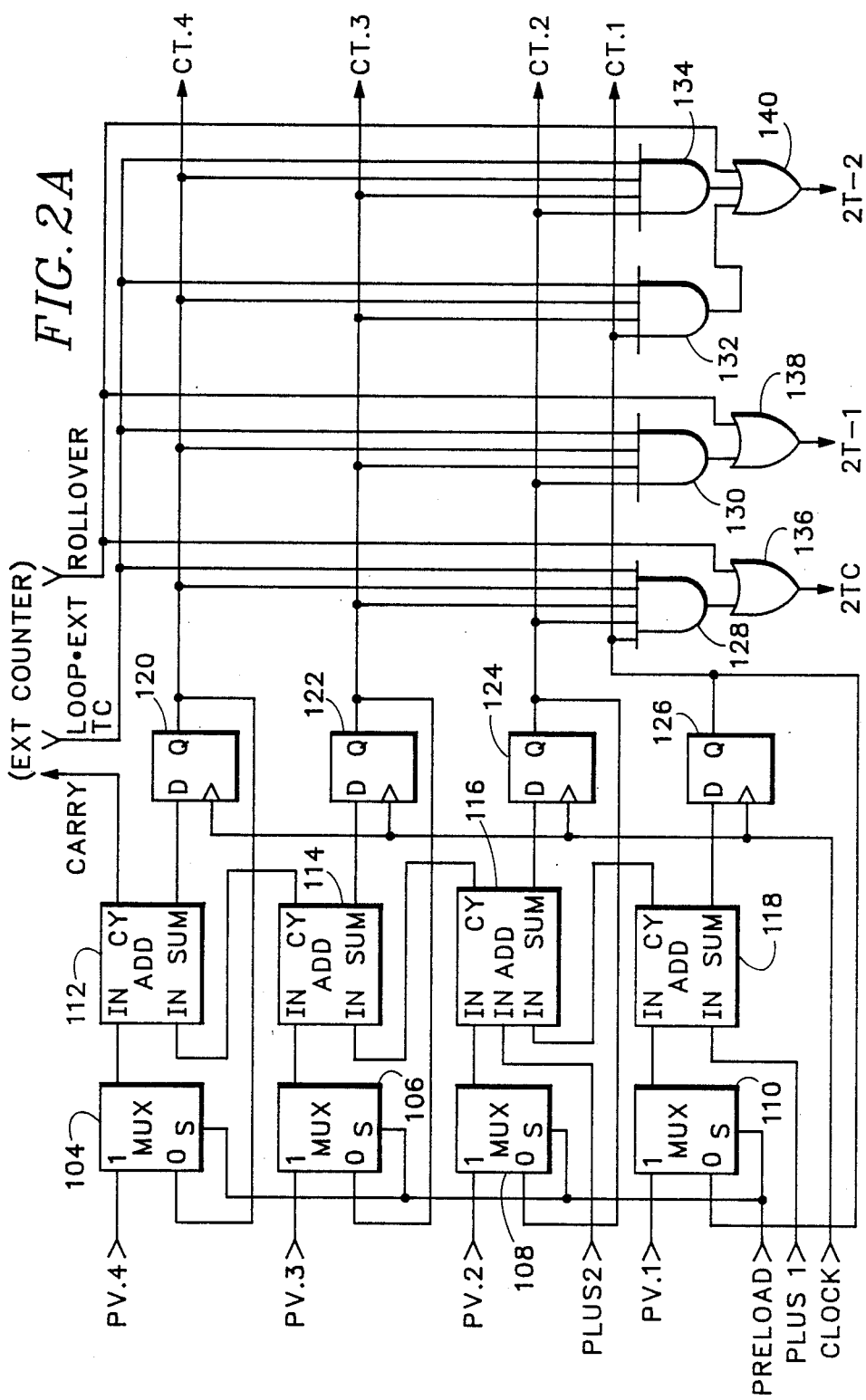
FIGS. 2A-2C are mixed block and schematic diagrams of the Counter/Timer circuitry.
Figure 2B:
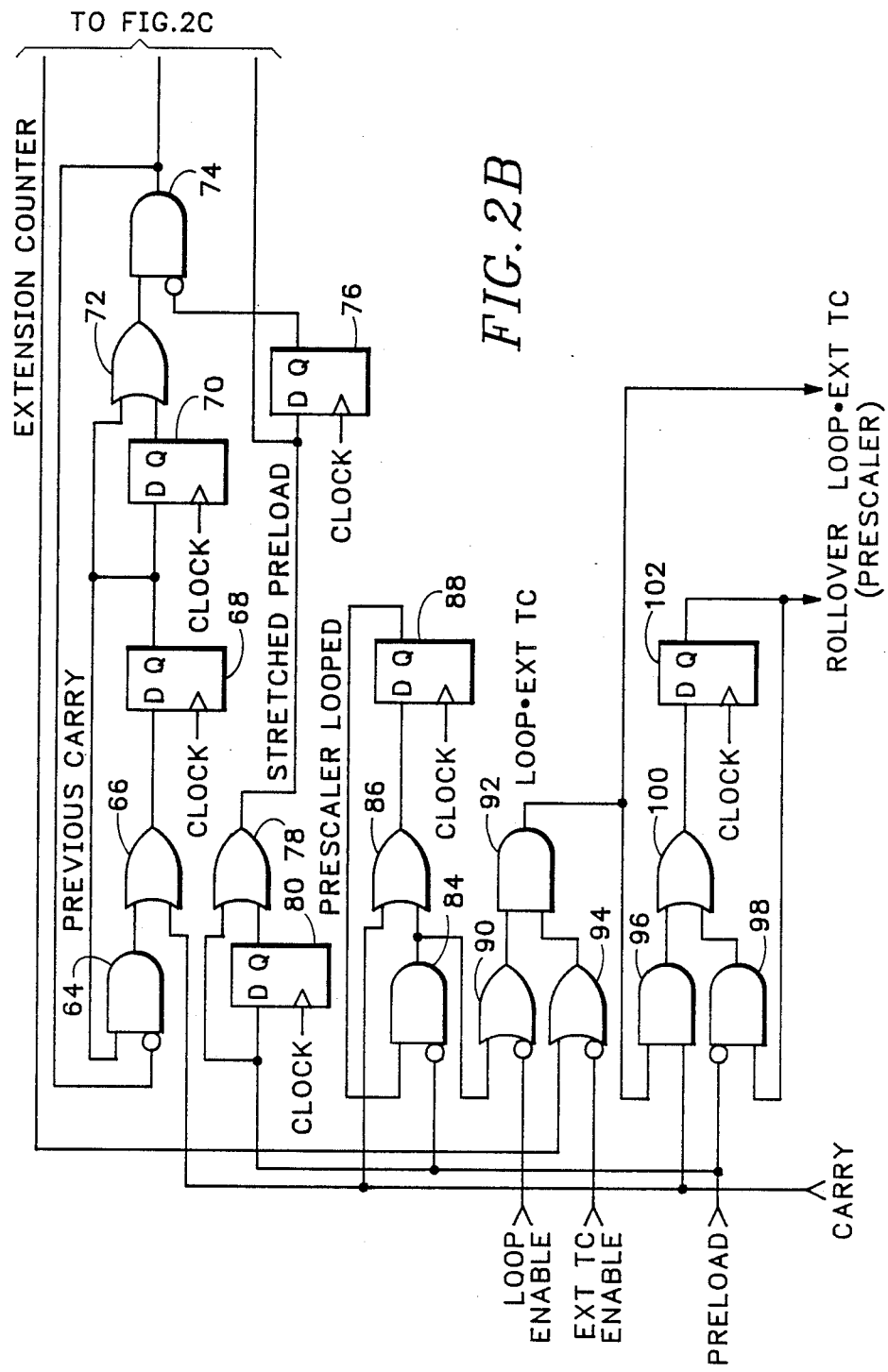
Figure 2C:
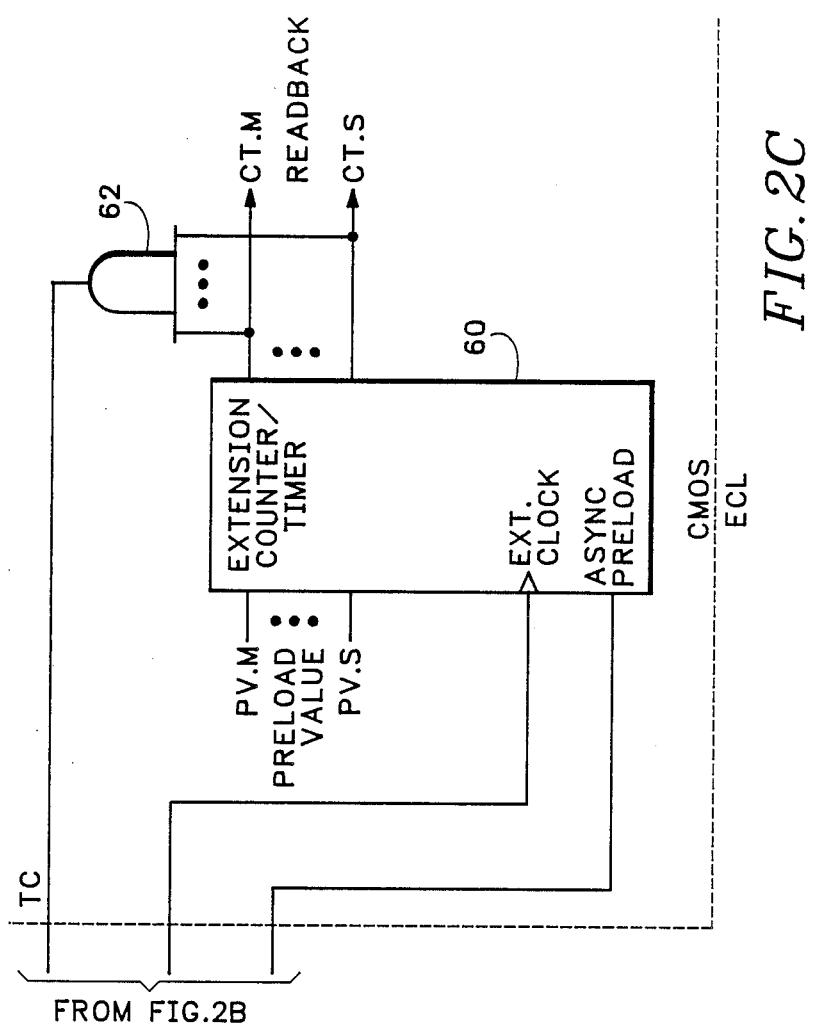

Referring now to FIGS. 2A, 2B and 2C, the Counter/Timer is divided into two basic portions, a fast Prescaler section 104-126 implemented in ECL and a slow Extension Counter/Timer 60 and 62 implemented in CMOS, plus assorted logic 64-102 and 128-140 implemented in the fast ECL portion of the circuitry. This two-speed approach saves money and power consumption, by not using the more expensive and power consuming ECL where its speed is not necessary.

Referring to FIG. 2A, the PRELOAD signal controls the state of Muxes 104-110, selecting for their outputs the respective PRELOAD VALUE bits (PV.X) or the outputs of flip-flops 120-126, which contain the present status of the respective counter/timer value bits (CT.X). The outputs of these Muxes 104-110 are inputs to Bit Adders 112-118, which have as their other inputs carry signals CY from the next least significant bits, except in the case of the least significant bit which has PLUS 1 as its other input. The second least significant bit Mux 116 has as a third input the PLUS 2 signal. The CY output of the most significant bit in the Prescaler becomes the CARRY signal that goes to FIG. 2B. The SUM outputs of the Bit Adders 112-118 are applied to the D inputs of the flip-flops 120-126, respectively. These flip-flops 120-126 are clocked by CLOCK and serve to hold the results of the last operation while the asynchronous circuitry around them is resolving what the next result is to be.

OR gates 136, 138, and 140 produce the signals $>=TC$, $>=T-1$, and $>=T-2$, respectively. OR gate 136 produces an active output wherever the signal ROLLOVER occurs or whenever the output of AND gate 128 is active, which happens whenever the outputs CT.1-4 all four flip-flops 12-126 are set and LOOP * EXT TC is true. OR gate 138 acts similarly, producing an active $>=T-1$ output if ROLLOVER is true or if the output of AND gate 130 indicates that CT.2, CT.3, and CT.4 are all true in conjunction with a true LOOP * EXT TC. And, OR gate 140 also acts similarly, except that it monitors for both a terminal count minus one condition through AND gate 134 and a terminal count minus two condition through AND gate 132.

Referring now to FIGS. 2B and 2C, the CARRY signal from the most significant bit of the Prescaler (104-126, FIG. 2A) passes through OR gate 66 and is clocked into flip-flop 68. When flip-flop 68 goes set, its positive going transition is felt through OR gate 72 and AND gate 74 as a clock input to the Extension Counter/Timer 60, which then counts. We have assumed for now that AND gate 74 is enabled by an inverted low output of flip-flop 76, which is normally reset, since STRETCHED PRELOAD is not usually active Referring now to FIG. 2A, as well as FIGS. 2B and 2C, the Prescaler 104-126 CARRY output can, however, occur during the same CLOCK cycle as PRELOAD command, when STRETCHED PRELOAD is still active. This can occur when the Prescaler 104-126 is preloaded with the value of 14 or 15 and the instructions from the Control Logic 10 (FIG. 1) cause a count of PLUS 2 or PLUS 1, respectively, to bring the total count to 16 during the same CLOCK cycle. The PRELOAD signal is stretched for an extra CLOCK cycle to become STRETCHED PRELOAD by the operation of flip-flop 80 and OR gate 78.

Referring now to FIGS. 1A and 1B, as well as FIGS. 2A-2C, if the source of the PRELOAD signal at the PRELOAD input of the Counter/Timer 40 is Mux 32, it arrives many gate delays after the CLOCK edge. This is because there are several levels of gates within Control Logic 10, as well as AND gate 20, Mux 32, and OR gate 44 in this path. This change then must also propagate through OR gate 78 to reach the ASYNC PRELOAD input of the Extension Counter/Timer 60. Because the slower CMOS circuitry of the Extension Counter/Timer 60 may require extra time to perform the preload operation, flip-flop 80 is used to extend PRELOAD to become STRETCHED PRELOAD which lasts one CLOCK cycle longer.

However, since the faster Prescaler 104-126 can already be counting during this time, the clock input to the Extension Counter/Timer arising from the occurrence of a CARRY signal must be delayed until the end of the STRETCHED PRELOAD signal. This is accomplished by flip-flop 76 and the lower input to AND gate 74. The output of flip-flop 76 does not go low and enable AND gate 74 until one clock cycle after STRETCHED PRELOAD goes false. While AND gate 74 is disabled, its low output is enabling AND gate 64 and preventing any clocking of the Extension Counter/Timer 60. With AND gate 64 enabled, the output of flip-flop 68 is returned to its input, so that even if CARRY goes away flip-flop 68 remains set until the first CLOCK after the inhibiting signal from flip-flop 76 goes low and permits the PREVIOUS CARRY signal through AND gate 74. When this occurs, the Extension Counter/Timer 60 receives its clocking transition and the signal back to AND gate 64 becomes disabling, changing the input to flip-flop 68. Thus, the Extension Counter/Timer 60 is given extra time to preload by the EXTENDED PRELOAD signal, and yet the CARRY signal is delayed but still utilized as PREVIOUS CARRY to clock the Extension Counter/Timer when it is ready.

Referring now to FIG. 2B, the arrival of the first CARRY signal is also felt through OR gate 86 at the input to flip-flop 88, where the next CLOCK stores it as a set condition. The feedback signal PRESCALER LOOPED from the output of flip-flop 88 through AND gate 84 and OR gate 86 keeps this flip-flop set until the first CLOCK after the next PRELOAD signal disables AND gate 84, removing the high from the input to flip-flop 88. If, however, another CARRY also appears during the same CLOCK cycle as the PRELOAD signal, it will keep the input to flip-flop 88 high, through OR gate 86, and the flip-flop will remain set.

The overall Counter/Timer 40 (FIG. 10) is set up in three basic ways selected by the status of the LOOP ENABLE and EXT TC ENABLE signals controlled by the microprocessor (not shown) For counts of fifteen or less, both LOOP ENABLE and EXT TC ENABLE are low. For counts of 16 to 31, LOOP ENABLE is made high and EXT TC ENABLE is made low. For counts of 32 or greater, both LOOP ENABLE and EXT TC ENABLE are made high.

Referring to FIGS. 2A, 2B and 2C, let us first analyze the operation of the Counter/Timer 40 (FIG. 1A) for a count of fifteen or less, say "3". The PRELOAD VALUE for the four least significant bits is "12" (the one's complement of 3), or PV.4 equals 1, PV.3 equals 1, PV.2 equals 0, and PV.1 equals 0. The higher order 48 bits for the Extension Counter/Timer 60 are loaded with all ones. LOOP ENABLE and EXT TC ENABLE are both low. However, LOOP ENABLE and EXT TC ENABLE are both inverted at the inputs to OR gates 90 and 94, respectively. Thus, both OR gates 90 and 94 have high outputs and AND gate 92 is satisfied from the outset, so that the signal LOOP * EXT TC is immediately true.

Referring now to FIG. 2A, because the LOOP * EXT TC signal is immediately true, as soon as the Prescaler 104-126 reaches a full count the AND gate 128 is satisfied and >=TC goes true. Let us assume that during the first CLOCK cycle a PLUS 1 signal is received and PRELOAD goes away. Mux 110 is outputting its lower (0) input from the output of the first bit flip-flop 126 and this value is a zero, since the same clock that brought about the change in PLUS1-MUX and PRELOAD-MUX also caused the PRELOAD VALUEs to be clocked into these flip-flops. Bit Adder 118 then has a zero on one input and a one on the other, so its SUM output goes high and its carry output remains low. On the next clock this one is clocked into flip-flop 126 and the external inputs, such as PLUS 1 and PLUS 2 may change.

At this point, with flip-flops 120, 122, and 126 set (CT.4, CT.3, and CT.1 true) and with LOOP * EXT TC true, all of the inputs to AND gate 132 are satisfied and the information that the Counter/Timer 40 (FIG. 1A) is greater than or equal to the terminal count minus two is forwarded through OR gate 140 to the Control Logic 10 as an asserted >=T-2.

Let us assume that during the next CLOCK cycle (second in our example) PLUS 1 goes to zero and PLUS 2 goes to one. The inputs of Bit Adder 116 are now seeing a high on PLUS 2, a low on the input from the carry output of the first bit and a low through Mux 108 from the output of flip-flop 124. Bit Adder 116 therefore produces a high on its SUM output and a low on its carry output. On the next CLOCK edge, the high on the SUM output of Bit Adder 116 sets flip-flop 124. And, since none of the other bits changed, there is now a high on the outputs of all of the flip-flops 120-126 and gates that produce >=T-2, >=T-1, and >=TC are all satisfied, since LOOP * EXT TC was made true by the low on signals LOOP ENABLE and EXT TC ENABLE, as described above.

The high on LOOP * EXT TC not only enables AND gates 128, 130, 132, and 134, but it also enables one side of AND gate 96, so that the next CARRY will satisfy it. If another count instruction is received and the Prescaler rolls over, CARRY is produced and AND gate 96 is satisfied The high output of AND gate 96 passes through OR gate 100 and puts a high on the D input of flip-flop 102. The next clock signal then sets flip-flop 102 and the signal ROLLOVER goes high. ROLLOVER bypasses AND gates 128, 130, 132 and 134 to keep >=T-2, >=T-1, and >=TC held high as the full count disappears from flip-flops 120-126 on the same clock.

ROLLOVER also perpetuates itself through AND gate 98 and OR gate 100, until the PRELOAD signal goes true and its inverted version disables AND gate 98 and flip-flop 102 resets (assuming that another CARRY does not occur at the same time). The occurrence of PRELOAD also disables AND gate 84 and thereby resets the PRESCALER LOOPED flip-flop 88 (assuming that another CARRY does not occur at the same time).

Let us next consider an example from the case where the count is within the range of 16 to 31, say 19. The first four bits are loaded with the same PRELOAD VALUE as in the last example and the Extension Counter/Timer 60 is loaded with all ones except in its least significant bit, PV.5. For this type of count, in the range from 16 to 31, LOOP ENABLE is caused to be high instead of low. With the high on LOOP ENABLE inverted on the input of OR gate 90, AND gate 92 will not be satisfied this time until the output of AND gate 84 goes high. The output of AND gate 84 does not go high until PRESCALER LOOPED goes high. PRESCALER LOOPED only goes high after a CARRY is received from the Prescaler 104-126. Thus, it can be seen that on the first clock after CARRY goes true, that high signal propagates through flip-flop 88, AND gate 84, OR gate 90, and AND gate 92 to produce a true on LOOP * EXT TC. However, before then, during the first time that the Prescaler is reaching its full count, all of the AND gates 128, 130, 132, and 134 that produce the >=TC, >=T-1, and >=T-2 signals are disabled by the absence of a high on LOOP * EXT TC. So, the first three counts, as before, take the Prescaler 104-126 to its full count.

The CARRY resulting from the first full count sets the least significant bit in the Extension Counter/Timer 60 (FIG. 2C), so that it is now at its full count and EXTENSION COUNTER TC soon goes true. However, since the CMOS circuitry is slow, to guarantee proper operation, the need for the EXTENSION COUNTER TC signal is obviated by the low on EXT TC ENABLE, which inverted satisfies OR gate 94 and thereby pre-enables one side of AND gate 92. This is especially necessary in the case where the PRELOAD VALUE to the Prescaler 104-126 is "1111" and a PRELOAD-MUX and a PLUS2-MUX occur at the same time followed by a series of PLUS2-MUXs. By the time that the STRETCHED PRELOAD is complete and the delayed EXT CLOCK is received, the Extension Counter/Timer 60 has very little time to produce EXTENSION COUNTER TC.

. The next sixteen counts cause the Prescaler 104-126 to count back up to a full count again, for a total of 19. During the second count up of the Prescaler, the signal PRESCALER LOOPED is high causing LOOP * EXT TC to be high, so that, as the terminal count is reached the second time, AND gates 128, 130, 132, and 134 are enabled and ready to produce their terminal count indicating outputs, >=T-2, >=T-1, and >=TC.

The high on LOOP * EXT TC not only enables AND gates 128, 130, 132, and 134, but it also enables one side of AND gate 96 (FIG. 2B), so that the next CARRY will satisfy it. As the Prescaler rolls over, CARRY is produced for the second time and AND gate 96 is satisfied. The high output of AND gate 96 passes through OR gate 100 and puts a high on the D input of flip-flop 102. The next clock signal then sets flip-flop 102 and the signal ROLLOVER goes high. ROLLOVER bypasses AND gates 128, 130, 132, and 134 to keep >=T-2, >=T-1, and >=TC held high as the full count disappears from flip-flops 120-126 on the same clock. ROLLOVER also perpetuates itself through AND gate 98 and OR gate 100, until the PRELOAD signal goes true and its inverted version disables AND gate 98 and flip-flop 102 resets. The occurrence of PRELOAD also disables AND gate 84 and thereby resets the PRESCALER LOOPED flip-flop 88.

Because the Counter/Timer 40 is permitted to continue counting after the occurrence of the TRIGGER and FREEZE, if additional PLUS 1 and PLUS 2 signals occur, both the Prescaler 104-126 and the Extension Counter/Timer 60 will continue counting on after TC has gone true and is being held high by ROLLOVER.

To continue with an example of the third case, values greater than 31, let us assume that the desired count is 35. The first four bits are preloaded with the same value (12) as in the preceding two examples, but this time the Extension Counter/Timer 60 is preloaded with a zero in the 6th bit PV.6 (second least significant bit in this counter) and all other bits are preloaded with ones To prepare the Counter/Timer 40 for counts greater than 31, both LOOP ENABLE and EXT TC ENABLE are made to be high.

The high levels of LOOP ENABLE and EXT TC ENABLE are both inverted on the inputs to the OR gates 90 and 94 so that neither OR gate produces a high output until their other inputs go true. Thus, AND gate 92 is not satisfied until PRESCALER LOOPED and EXTENSION COUNTER TC both become true. In the previous example we saw how the first CARRY from the Prescaler 104-126 operates to produce a PRESCALER LOOPED signal. That same CARRY signal also goes through OR gate 66, flip-flop 68, OR gate 72, and AND gate 74 (FIG. 2B) to provide a first clocking signal to the Extension Counter/Timer 60. This first clock changes the least significant bits of this counter from "101" to "110", and it is then one clock input away from producing its terminal count signal EXTENSION COUNTER TC at AND gate 62.

The second time that the Prescaler 104-126 rolls over and CARRY occurs, the resulting clock at the Extension Counter/Timer 60 takes its contents to all ones, AND gate 62 is satisfied, and EXTENSION COUNTER TC goes high. Because OR gate 90 already was producing a high output, the presence of a high on EXTENSION COUNTER TC, after it passes through OR gate 94, satisfies AND gate 92 and LOOP * EXT TC goes high. The high on LOOP * EXT TC not only enables AND gates 128, 130, 132, and 134, as has been discussed before, but it also enables one side of AND gate 96, so that the next CARRY will satisfy it.

As the Prescaler 104-126 approaches its full count for the third time, >=T-2, >=T-1, and >=TC are all produced. As the Prescaler rolls over, CARRY is produced for the third time and AND gate 96 is satisfied. The high output of AND gate 96 passes through OR gate 100 and puts a high on the D input of flip-flop 102. The next clock signal then sets flip-flop 102 and the signal ROLLOVER goes high. ROLLOVER bypasses AND gates 128, 130, 132, and 134 to keep >=T-2 >=T-1 and >=TC held high as the full count disappears from flip-flops 120-126 on the same clock.

ROLLOVER also perpetuates itself through AND gate 98 and OR gate 100, until the PRELOAD signal goes true and its inverted version disables AND gate 98 and flip-flop 102 resets. The occurrence of PRELOAD also disables AND gate 84 and thereby resets the PRESCALER LOOPED flip-flop 88.

Figure 3:
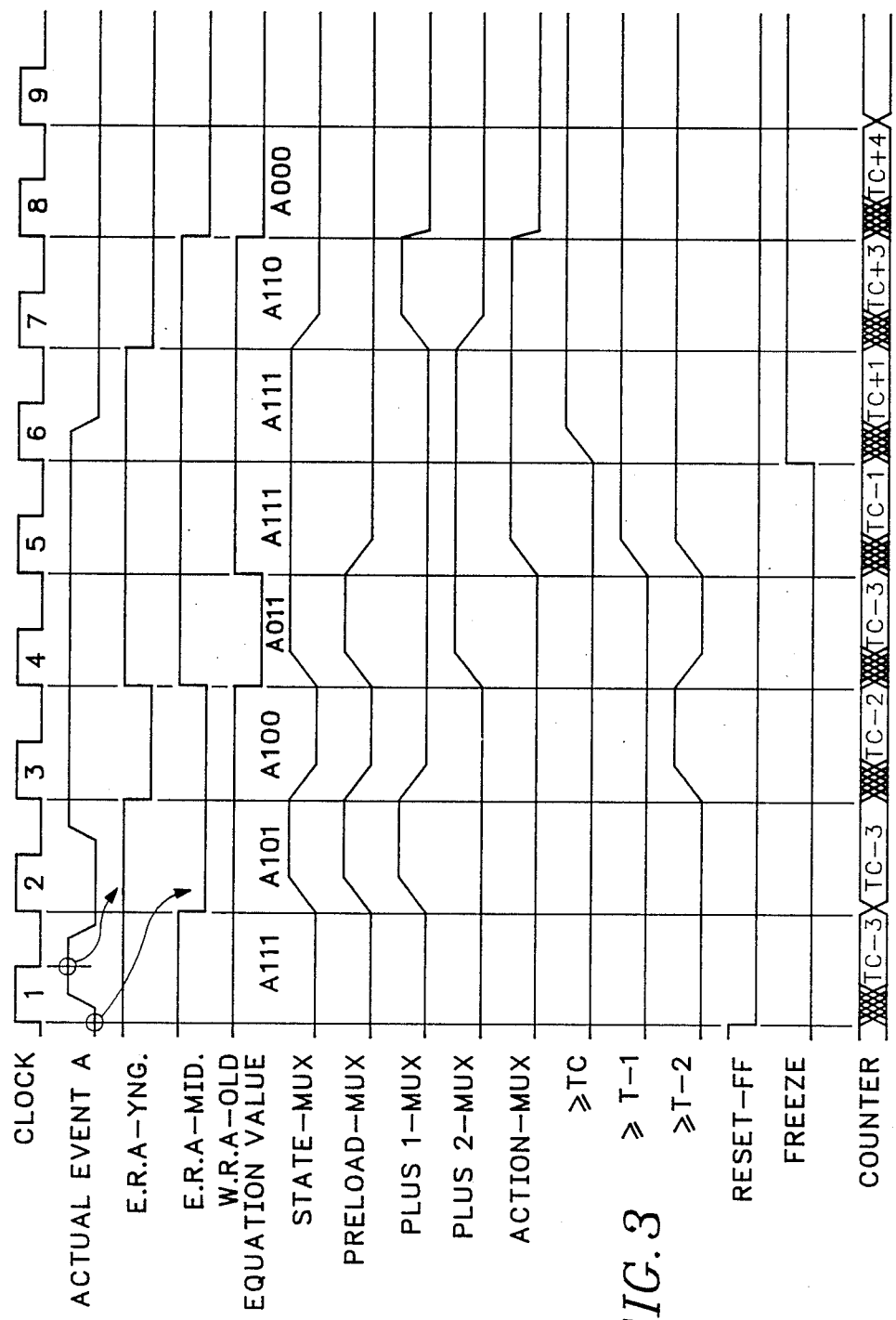
FIG. 3 is a timing diagram illustrating the operation of the Control Logic and Counter/Timer.

FIG. 3 is a timing diagram showing how the Control Logic 10, the auxiliary control logic 16-38, and Counter/Timer 40 operate together to perform a "duration greater than or equal to" measurement CLOCK cycles are shown on the first line, numbered in their high-going half cycles for reference. The second line of this timing diagram, "ACTUAL EVENT A", is the data that was sampled at the data acquisition probe. It can be changing asynchronously with the system CLOCK, so all we really know about it is its status at the time of the system CLOCK edges, shown for the first cycle as the points within the circles The rising edge of the 200 MHz system CLOCK is used throughout most of the logic analyzer to form a synchronous system. However, at the acquisition probe of the logic analyzer a second set of data acquisition flip-flips acquire their data using the falling edge of this clock, thus doubling the data sampling rate to an effective rate of 400 MHz. The data clocked using the rising edge of the system CLOCK is labeled "middle" data.

The data clocked using the falling edge is labeled "young" Both the "young" and the "middle" data are clocked into the system together on the next rising CLOCK edge. The arrows at the top left of FIG. 3 show how E.R.A-MID and E.R.A-MID are derived from ACTUAL EVENT A and describe its status during the previous CLOCK cycle. E.R.A-OLD tracks the value of E.R.A-YNG one CLOCK cycle later, thus reflecting the value for the half cycle previous to the current middle value.

The line labeled "Equation Value" in FIG. 3 contains a summary of the status of the lines E.R.A-YNG, E.R.A-MID, and E.R.A-OLD for Event Recognizer A, but in the order OLD-MID-YNG That is, a value such as "A011" means that, for Event Recognizer A's data, OLD is low, while MID and YNG are high. An example of "A011" can be seen under CLOCK cycle 4.

Referring now to both FIG. 3 and FIG. 1A-1B, the line in the timing diagram STATE-MUX describes the output of multiplexer 30. Multiplexer 30 is under the control of the signal RUN which also controls the other multiplexers 32, 34, 36, and 38. RUN controls whether STATE-MUX is the STATE-IDLE signal as qualified by AND gate 16 or the STATE-RUN signal as qualified by AND gate 18. If either FREEZE or RESET-FF are high, AND gate 16 is disabled. If RESET-FF is high, AND gate 18 is disabled.

The line in the timing diagram PRELOAD-MUX describes the output of multiplexer 32 which similarly, under the control of the signal RUN, selects between the signal PRELOAD-IDLE as gated by AND 20 and the signal PRELOAD-RUN Note that the state of the signal PRELOAD-MUX can be rendered irrelevant by the operation of RESET-FF through OR gate 44.

Multiplexers 34, 36, and 38 operate similarly to select between the IDLE and RUN versions of PLUS 1, PLUS 2, and ACTION to produce the next three signals shown in the timing diagram, PLUS1-MUX, PLUS2-MUX, and ACTION-MUX. The inputs to multiplexer 38 are not qualified by the state of FREEZE and RESET-FF as the other two are. This is because FREEZE's affects on ACTION are explicitly stated in the equations of the Control Logic block, to allow greater versatility in their implementation. RESET-FF is not included, as its effect is part of the function of the Trigger Machine block 50.

Note that many of the signals in this timing diagram, the ones from STATE-MUX down to $>=T-2$, appear to have slow rise and fall times This symbology is used to indicate that these signals are the product of several levels of logic gates operating asynchronously, and that stable and meaningful outputs are only available on these lines after the passage of some significant amount of time relative to the CLOCK signal that causes their inputs to change.

The signals $>=TC$, $>=T-1$, and $>=T-2$ are feedback from the Counter/Timer 40 to the Control Logic 10, informing it of the Counter/Timer status as it approaches the terminal count. As has been mentioned, the Counter/Timer 40 is implemented as an adder that counts up to a terminal count of all "1"s.

The last two signals shown in FIG. 3, RESET-FF and FREEZE, are the asynchronous signals RESET and TRIGGER synchronized by CLOCK in the flip-flops 52 and 54, respectively. FREEZE is used at AND gates 16, 20, 22 and 26 to block the IDLE inputs to the Muxes 30, 22, 34, and 36. As will be further clarified with an example, the FREEZE command puts the Counter/Timer 40 and the Control Logic 10 in a condition that permits the present measurement to be completed, but no further measurements to be started, once a trigger has occurred.

To illustrate the operation of the Control Logic 10 and its interaction with the Counter/Timer 40, the Trigger Machine 50, and the additional control logic 16-38, let us take the example of a Duration $>=$ measurement, the one illustrated in FIG. 3. As can be ascertained from Table 1, to select the "Duration $>=$" measurement type the Measurement Selection signals are set to all zeros. For this example, assume that the operator has indicated that he wants to trigger if Event Recognizer A remains true for 7.5 ns or longer. The desired count from the Counter/Timer 40 is then "3", so the PRELOAD VALUE is the one's complement "12", as in the first Counter/Timer operation example.

Before the acquisition is started, RESET is asserted and then dis-asserted. These changes are clocked through flip-flop 52 so that RESET-FF initializes the additional logic circuitry 16-38 and the Counter/Timer 40. RESET-FF causes a PRELOAD input to the Counter/Timer 40 through OR gate 44.

Referring to FIG. 3, on the rising edge of CLOCK cycle 1 RESET-FF goes low indicating the beginning of a measurement. The COUNTER value is TC-3, i.e., terminal count minus three. The outputs of the Muxes 30-36 XXXX-MUX are all low, as are the $>=TC$, $>=T-1$, and $>=T-2$ signals from the Counter/Timer 40. ACTUAL EVENT A remains high for all of this cycle, so E.R.A-YNG and E.R.A-MID are both high, as is E.R.A-OLD. Thus, the Equation Value is "A111. Referring to Table 1 tells us that for the "Duration $>=$" measurement type, we refer to line 0 of Tables 2A to 2D for the significance of our Equation Value of "A111" during idle and to line 8 of these Tables during run. Which state we are currently in, "Idle" or "Run", depends on the state of the signal RUN, while the state that we are about to go to is determined by the output of Mux 30 STATE-MUX. During the cycle preceding the beginning of our example RESET-FF has forced STATE-MUX low and, consequently, RUN is low during CLOCK cycle 1 and the system is in its idle state.

Looking first at Table 2A, line 0, we see that in idle "A111" is not one of the conditions that causes the STATE-IDLE line to go active, so it stays low, as it is shown in FIG. 3 under the first CLOCK cycle. Looking next at Table 2B, line 0, we see that in idle "A111" is not one of the conditions that causes the PRELOAD-IDLE line to go active either. And, looking at Tables 2C, 2D, and 2E, we see that in idle "A111" is not one of the conditions that causes any of the other equations to produce a "1" either. This is because the "Duration $>=$" measurement has to see a rising edge to start measuring.

Looking next at the activity during the second cycle of CLOCK, we see that in cycle one ACTUAL EVENT A started out low and then went high. Accordingly, during this cycle (2), E.R.A-YNG is high representing the second half of ACTUAL EVENT A during the first cycle, while E.R.A-MID is low representing the condition of ACTUAL EVENT A during the first half of that cycle. And, since E.R.A-OLD is the same as E.R.A-YNG was during the preceding cycle, it is still high. Thus, the Equation Value is "A101", indicating two transitions, one into and the other back out of the false state of Event Recognizer A.

This time when we refer to Table 2A, line 0, we find that the present Equation Value satisfies one of the ORed terms of this equation, i.e., "AX01" (X is "don't care") Thus, the STATE-IDLE signal goes high during this cycle as shown in FIG. 3. On the next CLOCK, STATE-IDLE go active to put Muxes 30-38 in the run condition.

Referring to Tables 2B and 2C, we find that this Equation Value "A101" satisfies both of these equations too, so PRELOAD-IDLE and PLUS1-IDLE both go high during this cycle also. The Control Logic makes PRELOAD-IDLE go active to make sure that the current PRELOAD VALUEs are loaded at the beginning of a new measurement. And, the Control Logic makes PLUS1-IDLE go active because the new high level of ACTUAL EVENT A, as inferred from the behavior of the E.R.A-XXXX signals, has only lasted 2.5 ns so far. (Recall that the Counter/Timer 40 is counting once for each 2.5 ns interval.) As a result of this PLUS 1 signal, the COUNTER value during the next cycle is TC-2.

Looking now at the next cycle of activity, ACTUAL EVENT A went back to low again and stayed there during both CLOCK edges of cycle two This is reflected in the status of E.R.A-YNG and E.R.A-MID during cycle three, which both are low for this cycle. E.R.A-OLD tracks the status of E.R.A-YNG during the last cycle and remains high. Thus, the Equation Value for this cycle is "A100".

Because STATE-MUX went high during the last cycle, this time when we consult the Tables, we should look at line 8 instead of 0. Looking first at Table A, line 8, we see that one of the ORed expressions is "AXX0" which matches our current value of "A100". But note that this whole expression is NOTed by the "n" in front of the parentheses. Thus these expressions inside the parentheses are the conditions that lead to a low output on STATE-RUN, and that is what happens now.

Looking next at Table 2B, line 8, we see that the one condition that would make this signal stay high does not match our current value. Similarly, neither of the line 8 conditions are satisfied for Tables 2C or 2D either. In Table 2E, line 16 is the operative equation, and it is not satisfied either. So, during this cycle, all five of the XXXX-MUX signals go back to low. The feedback signal > =T-2 from the Counter/Timer 40 goes high during this cycle, reflecting the PLUS1-MUX input during the last cycle On the next cycle of CLOCK, cycle 4, the Equation Value is "A011", reflecting the status of the signals E.R.A-OLD, E.R.A-MID, and E.R.A-YNG. We are now back in the idle state (RUN-not), since the rising edge of CLOCK clocked the low on STATE-MUX into flip-flop 42, making RUN go low. Accordingly, the XXXX-IDLE signals are the ones seen on all five of the XXXX-MUX signals. Checking the value "A011" in Table 2A, line 0, we find that we have a match with the first term, so STATE-MUX goes high during this cycle. We also have a match with one of the terms in Table 2B, line 0, so that PRELOAD-MUX also goes high during this cycle. PRELOAD-MUX passes through OR gate 44 and on into the PRELOAD input of the Counter/Timer 40 during this same cycle, thus causing the COUNTER value to go back to TC-3 some time before the end of this cycle.

Note that up until the start of this new measurement in cycle 4 the value of the measurement made at cycle 2 was retained. It is a desirable feature of this system that measurement values are preserved whenever possible The Equation Value "A011" also produces a change to high on the PLUS2-MUX line during this cycle (Table 2D, line 0). Because ACTUAL EVENT A was high for both halves of this cycle (cycle 4), the counter is incremented twice, once for each 2.5 ns interval. The equations in line 0 of the other two Tables, 2C and 2E, are not satisfied by this Equation Value, so PLUS1-MUX and ACTION-MUX remain low through the end of this cycle. During the next cycle (cycle 5), the Counter/Timer 40 output reacts to the PLUS2 input and ends up holding a COUNTER value of TC-1.

During CLOCK cycle 5, the Equation Value is "A111", reflecting the fact that ACTUAL EVENT A remained high throughout cycle 4. Because the STATE-MUX signal was high by the end of the preceding cycle, RUN has now gone high and we look at the run portions of the tables containing the Control Logic 10 equations Looking at line 8 of Table 2A, neither ORed term within the parentheses is satisfied, so the value of all of the terms within the parentheses is a zero, which, inverted by the "n" in front of the parentheses, makes the STATE-RUN output a one. Thus, STATE-MUX remains high during this cycle, and RUN will be high during the next cycle (cycle 6).

Still within cycle 5, looking at line 8 of Table 2B, the only term is not satisfied, so PRELOAD-MUX goes low during this cycle. Looking at line 8 of Table 2C, neither terms is satisfied, so PLUS1-MUX remains low during this cycle. And, looking at line 8 of Table 2D, the only term, "AX11", is satisfied, so PLUS2-MUX remains high throughout this cycle, causing the COUNTER value to go to TC+1 during cycle 6

Looking at line 16 of Table 2E, both the second and third terms, "T-1*AX1X" and "T-2*AX11", are satisfied, so ACTION-MUX goes high during this cycle. The terms T-1 and T-2 are high as a result of the signals > =T-1 and > =T-2 from the Counter/Timer 40 going high during this cycle. These Counter/Timer 40 outputs require some time after the active CLOCK edge to settle down. Then, after another short time, the outputs of the Control Logic 10 will also settle down, all within this cycle. Also within this cycle, the change in ACTION-MUX progresses through the Trigger Machine 50, so that TRIGGER also changes within this same cycle (cycle 5). This change is clocked into flip-flop 54 on the rising edge of CLOCK cycle 6 to produce a high on FREEZE. During that cycle the COUNTER value goes to TC+1 and > =TC goes high. From then on, until a RESET-FF occurs the signal ROLLOVER keeps > =TC, > =T-1, and > =T-2 high.

At the beginning of cycle 6, RUN is still high, so the relevant equations are found in the second half of each table. The Equation Value "A111" does not satisfy any of the terms within the parentheses on line 8 of Table 2A, so the inversion of that zero produces a high output on STATE-RUN. The high on STATE-RUN causes STATE-MUX to remain high for this cycle, leading to a RUN true condition again in the next cycle (7).

The presence of a true FREEZE signal disables the equation in line 8 of Table 2B, so that no further PRELOAD signals can occur until the FREEZE signal is reset by another change in the Trigger Machine. The high FREEZE signal is also disabling AND gates 16, 20, 22, and 26, so that the condition of all of the XXXX-IDLE signals will also be irrelevant until FREEZE is reset.

The Equation Value (during cycle 6) "A111" does not satisfy either of terms in line 8 of Table 2C, but does satisfy the only term in line 8 of Table 2D, generating another cycle of high signal on PLUS2-RUN and PLUS2-MUX and causing the Counter/Timer 40 to double increment again This is the desired result, since ACTUAL EVENT A was high during both halves of the last cycle. As a result of this third cycle of PLUS2-MUX high, the COUNTER value goes to TC+3 during the next cycle (cycle 7). And, as during the last cycle, the Equation Value of "A111", in conjunction with the high levels now remaining on T-1 and T-2, satisfies both of the last two terms of the equation on line 16 of Table 2E. Accordingly, ACTION-MUX remains high during this cycle.

During cycle 6 ACTUAL EVENT A goes false before the middle of the cycle, and so the Equation Value in cycle 7 is "A110". The desired behavior of the Counter/Timer 40 is to count by one, and that is what happens. "A110" satisfies the first term within the parentheses on line 8 of Table 2A, "AXX0", and the "n" inversion makes STATE-RUN and STATE-MUX go to low during this cycle. PRELOAD-RUN is still disabled by the FREEZE term in line 8 of Table 2B. "A110" also satisfies the first term of the equation on line 8 of Table 2C to generate a high PLUS1-RUN and PLUS1-MUX. PLUS2-RUN and PLUS2-MUX now go false since the equation on line 8 of Table 2D is no longer satisfied. SIGNAL-MUX remains high because the second term in the equation on line 16 of Table 2E is satisfied. The active PLUS1-MUX during this cycle causes the COUNTER value to go to TC+4 during the cycle 8.

Because STATE-MUX went low during cycle 7, RUN goes low on the rising edge of CLOCK cycle 8. A low on RUN selects the IDLE inputs of all of the Muxes 30-38 that generate the signals XXXX-MUX But, all of the XXXX-IDLE inputs are blocked by FREEZE, so that no further PLUSX-MUX signals or PRELOAD-MUX can supply an active input to the Counter/Timer 40 until RESET-FF occurs. Note, in FIG. 3, that PLUS1-MUX and ACTION-MUX go low faster as a result of the RUN signal than they normally do as a result of the operation of the Control Logic 10.

From the beginning of cycle 8 until the Trigger Machine goes to some new state and a RESET-FF occurs, generating a PRELOAD and clearing the Counter/Timer's 40 assorted logic 64-102 and 128-140, the results in the Counter/Timer 40 are preserved and available for readback by the microprocessor (not shown).

Referring again to FIG. 1, as has been noted above, there are several layers of gates inside the Control Logic block 10, all of which runs asynchronously. With the additional gates and muxes of additional control logic 16-38 and 44 feeding into another level or two of gates internal to the Counter/Timer 40, the total number of asynchronous gate delays becomes a problem at high system CLOCK rates.

Figure 4A:
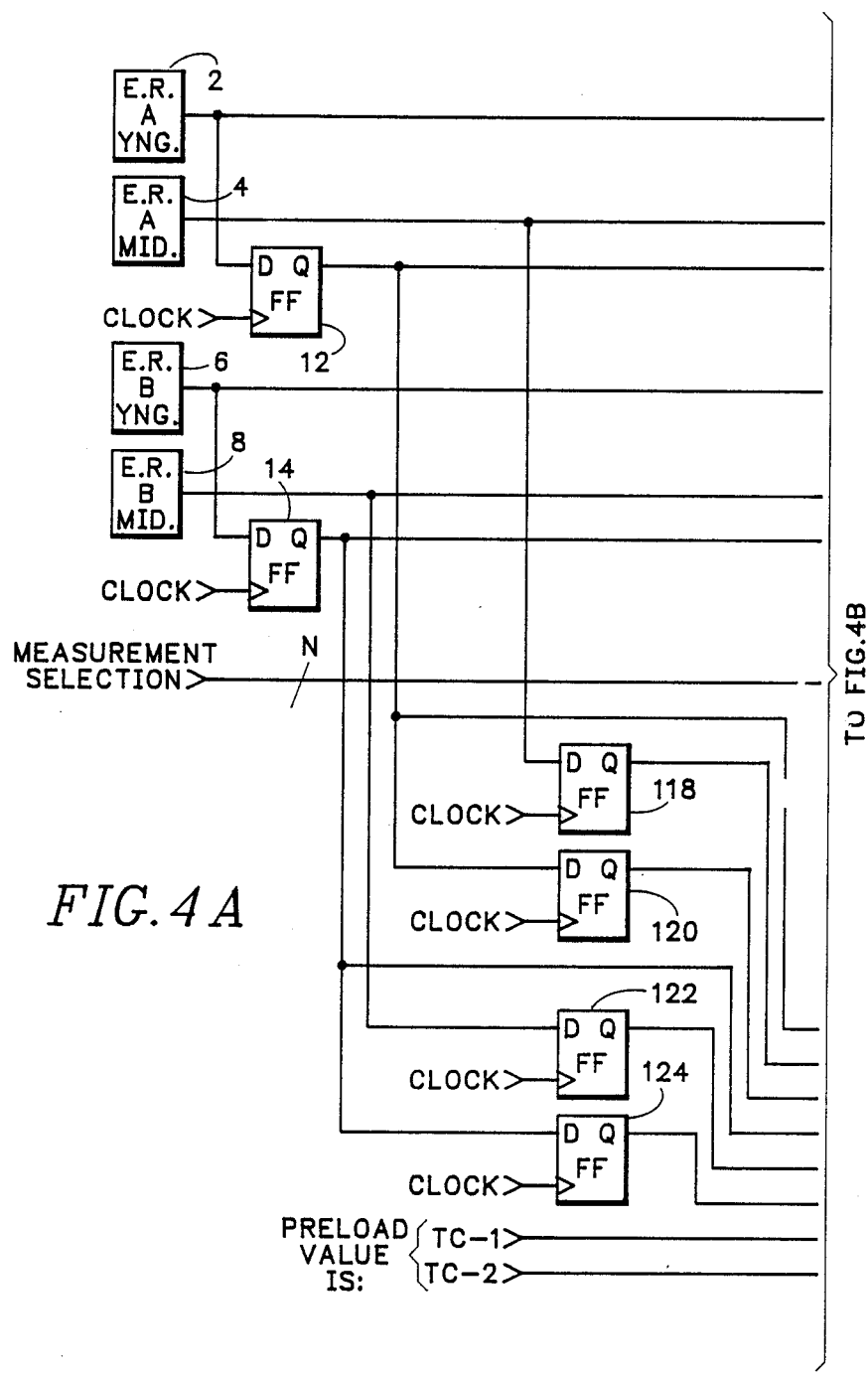
FIG. 4A–4C are a mixed block and schematic diagram of another version of the Control Logic, Counter/Timer, and Trigger Machine.
Figure 4B:
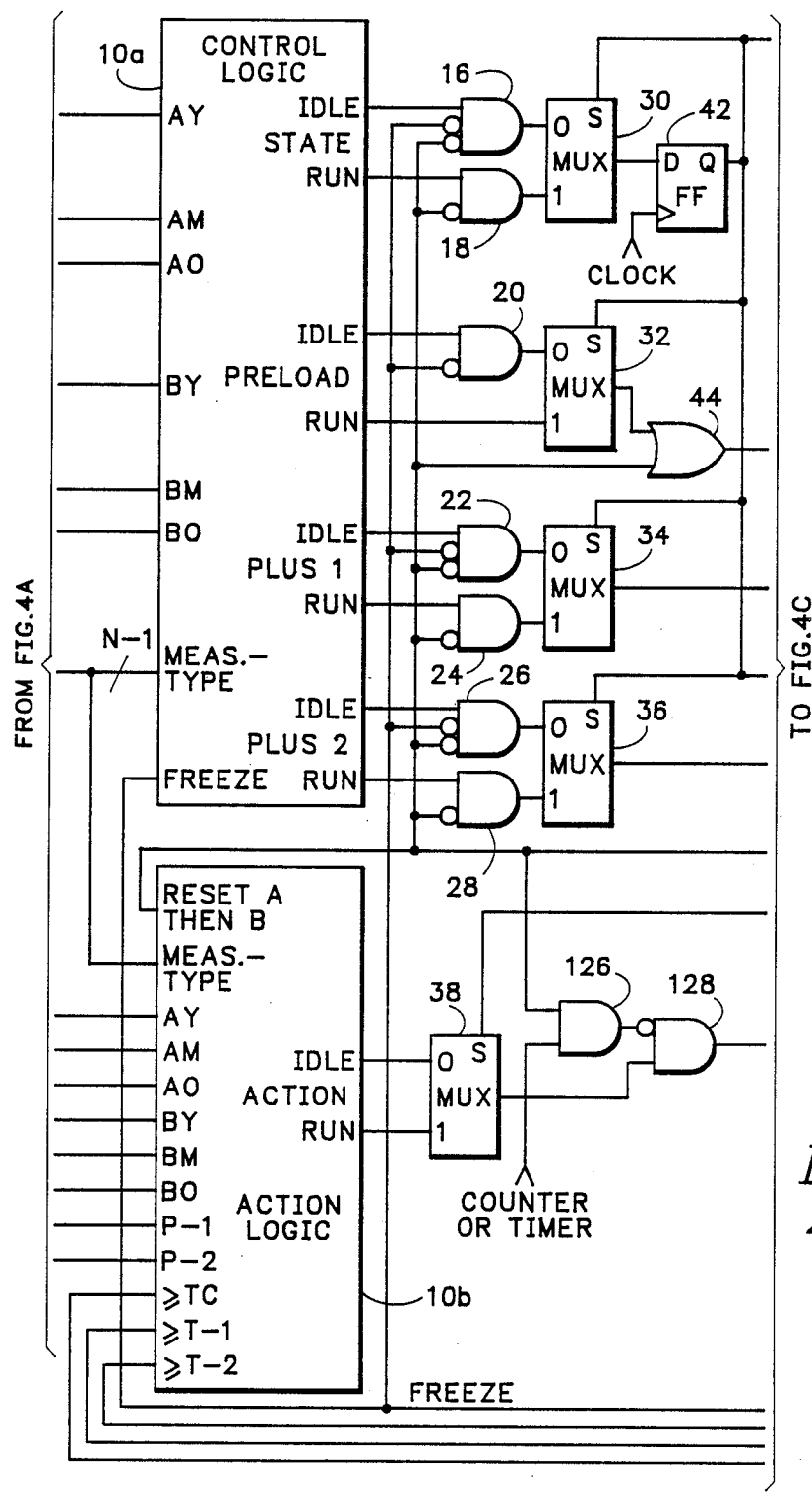
Figure 4C:
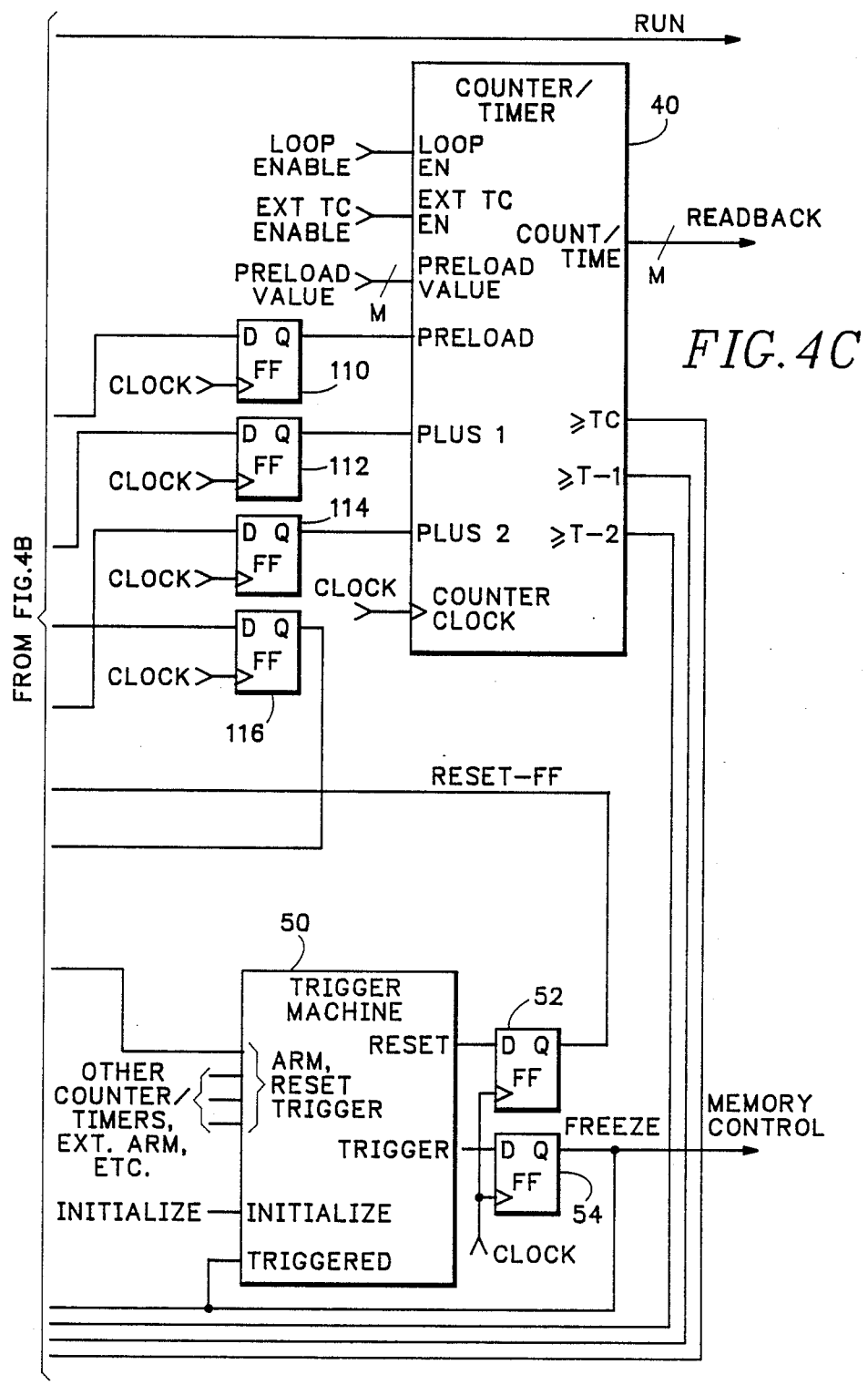

FIGS. 4A-4C show an alternative circuit arrangement that permits higher system CLOCK rates. The Control Logic 10 of FIG. 1A is divided into two parts in FIG. 4B, Control Logic 20a and Action Logic 20b. Additional flip-flops 110-116 (FIG. 4C) and 118-124 (FIG. 4A) permit the Counter/Timer 40, Action Logic 10b, and the Trigger Machine 50 to run one CLOCK cycle behind the Control Logic 10a. This permits a higher speed of operation, but with the consequence that the occurrence of FREEZE is delayed one CLOCK cycle in getting back to the Control Logic 10a and additional logic gates 16-28 (FIG. 4B). In those rare instances where a measurement ends at the end of one cycle and immediately starts again during the middle of the next cycle, this delayed FREEZE signal arrives too late to preserve the result of the first measurement and prevent the second one; instead, the second measurement runs to completion and its result is the one preserved AND gates 126 and 128 (FIG. 4B) act to block the ACTION-MUX signal from reaching the Trigger Machine if a RESET-FF occurs during the last CLOCK cycle of a measurement that uses the Counter/Timer 40.

It may be noted, in connection with FIGS. 4A-4C, that N lines of Measurement Selection signals go to the Action Logic 10b, while only N-1 go to the Control Logic 10a. This is because the logic for the STATE, PRELOAD, PLUS1, and PLUS2 signals does not care whether the measurement involved is greater than or equal to (>=) or less than (<), but the ACTION signal does. This additional bit is necessary to select among the sixteen run and sixteen idle equations of Table 2E, but is not required to select among the eight run and idle equations of Tables 2A-2D.

While a preferred embodiment of the present invention has been shown and described, it will be apparent to those skilled in the art that many changes and modifications may be made without departing from the invention in its broader aspects. The claims that follow are therefore intended to cover all such changes and modifications as fall within the true spirit and scope of the invention.

I claim:

1. A method for counting/timing intervals of interest in a digital data acquisition instrument, the method comprising the steps of:
   acquiring data by sampling actual data using a plurality of phases of a system clock;
   separately recognizing events in the data acquired using each system clock phase;
   aligning the data acquired using each system clock phase to a same edge of the system clock;
   aligning the separately recognized events to the same edge of the system clock;
   reconstructing, from the aligned separately recognized events, intervals of interest in the actual data with a resolution as high as the plurality of phases permits so that the intervals of interest may be counted/timed with the resolution as high as the plurality of phases permits.

2. A method as recited in claim 1 wherein the reconstructing step comprises the steps of:
   ascertaining from the aligned separately recognized events the total number of phases within each cycle during which the actual data was within the interval of interest;
   stepping a counter/timer by the total number of phases during which the actual data was within the interval of interest.

3. A digital data acquisition instrument having a counter/timer for measuring intervals of interest in actual data at a resolution permitted by sampling the actual data at times determined by a plurality of phases of a system clock, the instrument comprising:
   a plurality of data event recognizers, each one associated with one of the plurality of phases of the system clock, for producing outputs indicative of whether or not a particular data event is present at the time of a sample;

control logic means for monitoring the outputs of the plurality of data event recognizers and producing count instructions indicative of the number of phases of the system clock during which the particular data event was present; and a counter/timer with the capability of being able to increment by any of a plurality of values in one clock cycle, the plurality of values being at least as large as the plurality of system clock phases, with the counter/timer being coupled to be responsive to the count instructions from the control logic to count/time the interval of interest.

4. A digital data acquisition instrument as recited in claim 3 wherein the control logic means comprises logic gates.

5. A digital data acquisition instrument as recited in claim 3 wherein the control logic means comprises memory means.

6. A digital data acquisition instrument as recited in claim 3 wherein the counter/timer comprises:

a prescaling section implemented in a fast technology; and an extension counter/timer section implemented in a slower technology.

7. A digital data acquisition instrument as recited in claim 6 further comprising assorted logic implemented in the fast technology for bypassing the extension counter/timer section during short counts.

8. A digital data acquisition instrument as recited in claim 7 further comprising other assorted logic implemented in the fast technology for stretching a preload command to accommodate the slower technology of the extension counter/timer section.

* * * * *